(12) United States Patent
Judkins et al.

(10) Patent No.: US 11,495,698 B2
(45) Date of Patent: Nov. 8, 2022

(54) RECONFIGURABLE PHOTOVOLTAIC LAMINATE(S) AND PHOTOVOLTAIC PANEL(S)

(71) Applicant: SunPower Corporation, San Jose, CA (US)

(72) Inventors: Zachary S. Judkins, Berkeley, CA (US); David C. Okawa, Belmont, CA (US); Brian S. Wares, Berkeley, CA (US); Tamir Lance, Los Gatos, CA (US); Patrick L. Chapman, Austin, TX (US)

(73) Assignee: SunPower Corporation, San Jose, CA (US)

( * ) Notice: Subject to any disclaimer, the term of this patent is extended or adjusted under 35 U.S.C. 154(b) by 277 days.

(21) Appl. No.: 16/376,776

(22) Filed: Apr. 5, 2019

(65) Prior Publication Data

US 2019/0312159 A1 Oct. 10, 2019

Related U.S. Application Data

(60) Provisional application No. 62/653,907, filed on Apr. 6, 2018.

(51) Int. Cl.
*H01L 31/0216* (2014.01)
*H01L 31/0475* (2014.01)
*H01L 31/05* (2014.01)

(52) U.S. Cl.
CPC .... *H01L 31/02167* (2013.01); *H01L 31/0475* (2014.12); *H01L 31/0504* (2013.01)

(58) Field of Classification Search
CPC ... H02S 20/25; H02S 40/36; H01L 31/02167; H01L 31/0475; H01L 31/0504
See application file for complete search history.

(56) References Cited

U.S. PATENT DOCUMENTS

| | | | |
|---|---|---|---|
| 9,412,890 B1* | 8/2016 | Meyers | H01L 31/0504 |
| 2009/0242015 A1* | 10/2009 | Wattman | H01L 31/048 |
| | | | 136/251 |
| 2012/0118349 A1* | 5/2012 | Keenihan | H01R 12/79 |
| | | | 136/244 |
| 2013/0062958 A1* | 3/2013 | Erickson, Jr. | H02J 1/102 |
| | | | 307/82 |
| 2013/0146125 A1* | 6/2013 | Meyers | H02S 40/36 |
| | | | 136/251 |
| 2015/0207456 A1* | 7/2015 | Han | H02S 40/32 |
| | | | 136/244 |
| 2017/0187328 A1* | 6/2017 | Miljkovic | H02S 40/36 |
| 2018/0006463 A1* | 1/2018 | Bintz, II | H02J 3/381 |
| 2019/0044323 A1* | 2/2019 | Deline | H02S 40/34 |

* cited by examiner

*Primary Examiner* — Golam Mowla
(74) *Attorney, Agent, or Firm* — Grasso PLLC

(57) ABSTRACT

Reconfigurable PV panels can have features that include cut lines for separating full panels into smaller subpanels, connector ribbons for assembling several reconfigurable PV panels into a one-dimensional or two-dimensional array and can be stacked upon each other and unstacked by rotating them about a shared connection.

20 Claims, 13 Drawing Sheets

RECONFIGURABLE PHOTOVOLTAIC LAMINATE(S) AND PHOTOVOLTAIC PANEL(S)

RELATED APPLICATION

This application claims the priority of U.S. provisional application 62/653,907, which was filed on Apr. 6, 2018 and is entitled Reconfigurable Photovoltaic Panel(s). The '907 application is incorporated herein by reference in its entirety.

BACKGROUND

Photovoltaic (PV) cells, commonly known as solar cells, are devices for conversion of solar radiation into electrical energy. Generally, solar radiation impinging on the surface of, and entering into, the substrate of a solar cell creates electron and hole pairs in the bulk of the substrate. The electron and hole pairs migrate to p-doped and n-doped regions in the substrate, thereby creating a voltage differential between the doped regions. The doped regions are connected to the conductive regions on the solar cell to direct an electrical current from the cell to an external circuit. When PV cells are combined in an array such as a PV laminate, the electrical energy collected from all of the PV cells can be combined in series and parallel arrangements to provide power with a certain voltage and current.

A PV laminate comprises one or more PV cells and a supporting substrate. These PV cells are arranged in an array and are positioned on the PV laminate to receive light for conversion into electrical voltage. The PV laminates are manufactured in square and rectangular shapes and may have a supporting frame and their own electrical converters, in which case they are considered a DC module or AC module depending upon the type of electrical voltage output by the electrical converter. Several PV panels, i.e., laminates with support frames, may themselves be arranged in an array and these arrays may be installed on the roof of a building or other support structure configured to support the array of laminate panels. These arrays may be one-dimensional, e.g. 1 PV panel×5 PV panels, as well as two-dimensional, e.g., 2 PV panels×5 PV panels. Once installed, the arrays of PV panels may be connected in a series, daisy chain fashion, in order to deliver their electrical power to an outside load.

DETAILED DESCRIPTION

Figure 1:
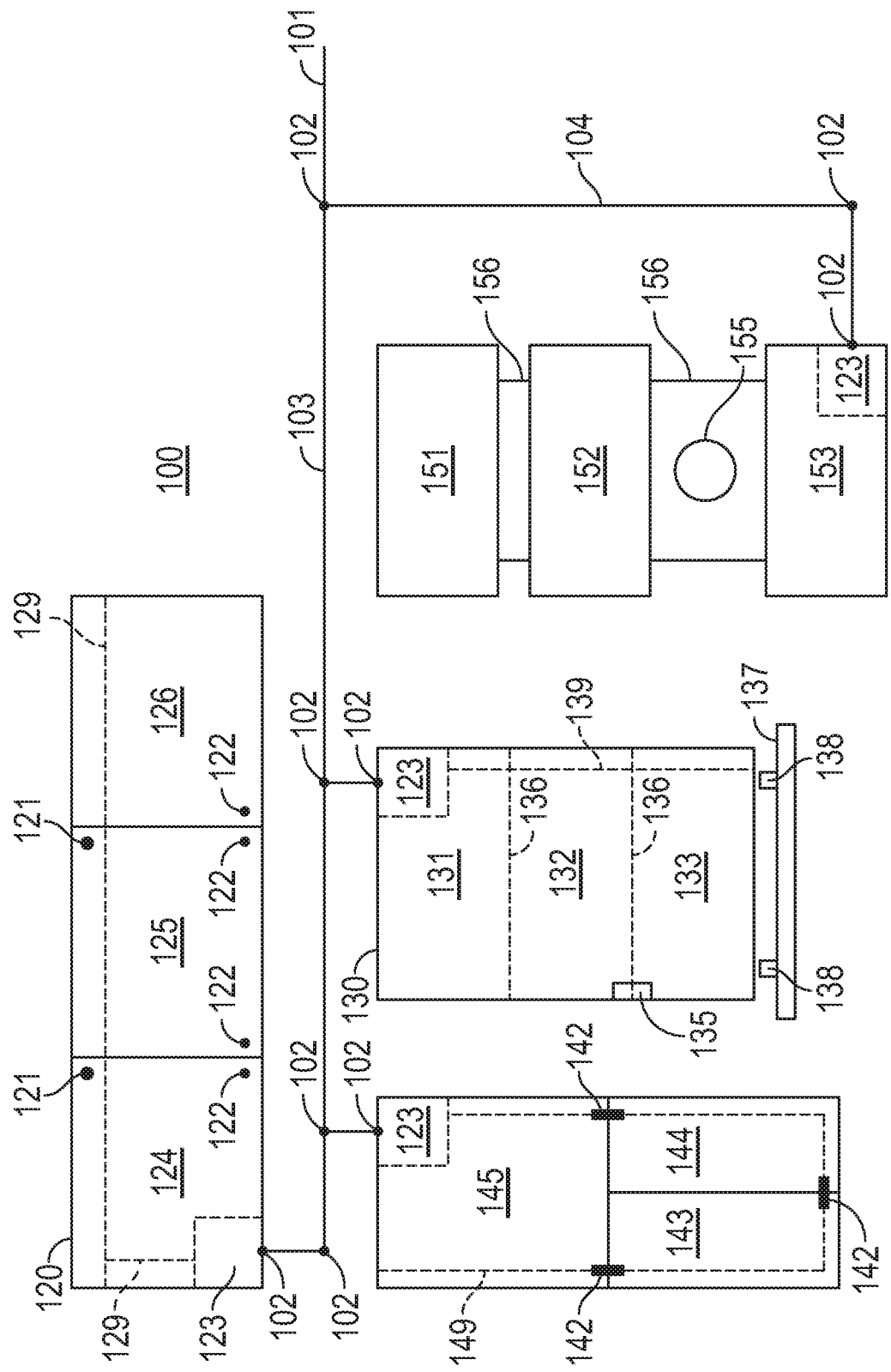
FIG. 1 illustrates a system with installed reconfigurable PV laminates as may be employed according to some embodiments.

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"About" or "approximately". As used herein, the terms "about" or "approximately" in reference to a recited numeric value, including for example, whole numbers, fractions, and/or percentages, generally indicates that the recited numeric value encompasses a range of numerical values (e.g., +/−5% to 10% of the recited value) that one of ordinary skill in the art would consider equivalent to the recited value (e.g., performing substantially the same function, acting in substantially the same way, and/or having substantially the same result).

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph nor 35 U.S.C. § 112(f), for that unit/component.

"First," "Second," etc. As used herein, these terms are used as labels for nouns that they precede, and do not imply any type of ordering (e.g., spatial, temporal, logical, etc.). For example, reconfigurable PV panels may have various topologies. These topologies may include having cut-lines for changing the shape of a single PV panel as well as having mechanical connectors for enabling an unwinding of stacked PV panels and mechanical and electrical leads to allow for obstruction avoidance or other installation challenges. Some topologies may also employ rigidity supports that can provide stabilization to an installation as well as severable noncontinuity connections, which can allow for PV panels to be cut along these connections without leaving exposed active electrical wiring after the cut is made.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following description, numerous specific details are set forth, such as specific operations, in order to provide a thorough understanding of embodiments of the present disclosure. It will be apparent to one skilled in the art that embodiments of the present disclosure may be practiced without these specific details. In other instances, well-known techniques are not described in detail in order to not unnecessarily obscure embodiments of the present disclosure.

This specification describes exemplary reconfigurable PV laminates, laminates with frames, i.e. PV panels, PV panels with microinverters, i.e., PV modules, and various related components and systems. Reconfigurable PV laminates and PV panels may be helpful in that during installation their shape or size may be changed to better accommodate the existing or anticipated installation site. For example, if a southerly facing roof surface is 10 meters by 10 meters and the reconfigurable PV laminates are 1.0 meters×1.5 meters some of the reconfigurable PV laminates may be installed without being reconfigured but several of the PV laminates may be cut shorter to fit within the 10 meter by 10 meter space such that a larger portion of the entire available roof space may be covered by the PV panels. In some installations, the laminates and/or panels may also employ electrical and mechanical connections to allow PV panels or PV subpanels to avoid an obstruction in as an efficient a manner as possible. In other words, if a roof penetration falls in the middle of a PV panel, the PV laminate may be cut at its closest cut line and the electrical and mechanical connections may be used to connect adjacent PV panels around the obstruction. Similarly, reconfigurable PV panels with flexible leads between them, may also be employed to avoid the obstruction, where the flexible leads can be used to space connected PV panels around the obstruction. Embodiments may also employ rigidity bars or other rigidity support structures to provide support to PV laminates and/or panels. These rigidity structures may be located along one or more edges of one or more PV laminates or panels, and may serve to position a PV laminate or panel or laminates or panels at an installation site in addition to providing rigidity to the installed laminate or panel, to provide support against uplift caused by wind or other forces, and for other purposes, as well. Moreover, the rigidity structures may also serve to reduce pressure differentials between portions of the PV laminates or PV panels including the top surface and bottom surfaces of the PV laminates or panels. The reconfigurable nature of the PV laminates and/or panels may also provide for shipping efficiencies at least attributable to reduced spacing and manufacturing improvements at least attributable less retooling to manufacture different size PV laminates or panels.

The connections, such as the swivel connection, may provide manufacturing advantages, as production may be broken down into subpanels that may be aggregated during assembly and then unfolded or unstacked into a larger system at an installation site. In other words, large runs of the same size PV laminate or PV panel may be accomplished and these same size PV laminates or PV panels may, nevertheless, be suitable for many different installation sizes and layouts.

Viability of how a reconfigurable PV laminate or PV panel can be reconfigured can be dependent on the flexibility of a microinverter servicing the reconfigurable panel. For example, a first microinverter may be sized and configured to support one-half or more of a single PV laminate or PV panel, so in this instance the PV laminate or PV panel may be cut in half, but no less. A second microinverter may be sized and configured to support three-quarters or more of a reconfigurable PV laminate or PV panel, so in this instance, only one-fourth of the PV laminate or PV panel may be removed when this second microinverter is part of the PV module system. Similarly, a microinverter or other converter may be sized to service 1.5 or 1.75 or even 2.25 laminates/panels or more, which would allow many PV subpanels/laminates to be connected to a single microinverter, even if they in total produce more power than a single PV panel or PV laminate.

Embodiments may also enable arrangement of PV laminates or PV panels wherein adjacent laminates or panels may overlap each other, which may be referred to as shingling. This shingling may be in either the X or Y direction, or in both directions, where overlap can serve to increase the available exposed PV cell surface area as well as improve water shedding capabilities of an installed PV system, or for other purposes, as well. Extension cables, connection ribbons, or other connection systems may also be employed. These extension cables or ribbons or connection systems may be long in certain instances, e.g., 0.5, 0.75, and 1 meter or more, such that subpanels may be optimally positioned around obstacles as well as roof contours at an installation site. These extension cables or ribbons or connection systems may be short in certain instances, e.g., 0.1, 0.2, and 0.25 meters or less, such that subpanels may be optimally positioned about each other and/or mimic roof contours or provide other accommodative aspects.

As shown in certain Figures, reconfigurable PV subpanels/laminates may be laminated individually with wire leads extending out of one or more of them. Multiple reconfigurable PV subpanels/laminates may be connected together. In some embodiments, when the connecting cables are long enough, extra degrees of freedom of movement for positioning the PV panels or PV laminates can be obtained, thereby allowing for extra maneuverability on the roof and in some instances can allow for conventional shingling of the PV panels or PV laminates, e.g., similar in concept to how roofs are shingled with asphalt roof shingles. Some embodiments may reduce the complexity of reconfigurable PV panels or PV laminates with elaborate connection systems by making the cables shorter and allowing shingling in only one direction but, nevertheless, maintaining the ability to avoid obstacles.

Embodiments may also provide flexibility whereby multi-conductor cabling may be employed. For example, if the cable connecting subpanels/laminates is multi-conductor, then each subpanel can be in parallel. For instance, if the voltage is <30V/panel then safety regulations may allow an installer to cut panels/laminates away in the field while leaving exposed conductors. This may be advantageous when customizing to a particular roof structure. In other words, when a reconfigurable PV panel or PV laminate is cut, if operating voltages are low, a termination cap or some type of live conductor termination system may not be required because of the low exposed potential. However, in embodiments, a termination cap or some type of live conductor termination system may be employed. Other cut connection termination topologies may also be employed in embodiments.

FIG. 1 shows a roof 100 with multiple reconfigurable PV laminates and panels employed in a single PV power production system. Various types of reconfigurable PV laminates are shown coupled to a shared cable 103 via nodes 102 in FIG. 1 for ease of description, however any desirable number, type or combination of reconfigurable PV laminates and panels in a PV system can be provided.

PV laminates 124, 125, and 126 were previously stacked upon each other and are shown connected via pivot connectors 121. Once unstacked, the PV laminates may be held relative to each other via mechanical connectors 122. A micro-inverter 123 is also shown receiving a DC voltage from the three PV laminates and supplying an AC voltage to a shared cable 103 via nodes 102. As described in more detail below with regard to FIGS. 9-11, stacked laminates may unstack from each other by pivoting about the pivot connectors 121 holding adjacent laminates together. In FIG. 1, laminate 124 may be pivotably connected to laminate 125 and laminate 125 may be pivotably connected to adjacent laminate 126. The three laminates may be stacked atop one another so they occupy the space of a single laminate and then, prior to installation the laminates may be opened up to form the 1×3 array shown in FIG. 1. As pivot connectors 121 allow for rotation, once the laminates are positioned in their final orientation, they may be secured with mechanical connectors 122 as well. Ribbon cabling 129 is shown electrically connecting each of the three laminates 124, 125, and 126 to each other and to the microinverter 123. The PV laminates 124, 125, and 126 may be mounted on frames before or after being installed so as to be considered framed PV modules or PV panels in their final installation.

PV panels 143, 144, and 145 are shown in FIG. 1 connected by jumper connectors 142. These jumper connectors 142 can serve to connect PV panels or PV laminates together mechanically and electrically. The PV panels 143, 144, and 145 are shown electrically connected through the ribbon cabling 149 and this ribbon cabling is shown to feed a microinverter 123. The microinverter 123 of PV panel 145 is also shown feeding output voltage from the PV panels 143, 144, and 145 to cabling 103 via nodes 102. As described in more detail below, the jumper connectors 142 can allow PV laminates and PV panels of different sizes to be connected such that varying output voltages may be supplied to a load or other output. In FIG. 1, PV panel 145 is shown to be twice as large as each of PV panels 143 and 144. Provided that each PV panel has the same PV cell density, PV panel 145 would produce an output voltage twice as large as either PV panel 143 or 144 under the same solar irradiation. Thus, two-times the voltage of PV panel 145 is produced at microinverter 123 of PV panel 145. If a different voltage multiplier was sought, for example, 2.25 x voltage of PV 145, another half panel, the size of PV panel 143 or PV panel 144 could be added via a jumper connector 142 in order to supplement the available voltage at the microinverter by the additional voltage produced by the new panel. Thus, in embodiments, flexibility may be provided for creating desired voltage outputs using different sized PV laminates or PV panels and connecting them together in a more tailored way than only combining full 96 cell PV panels.

FIG. 1 also shows a PV laminate 130 that has three remaining subsections after one quarter of the PV laminate 130 has been removed. Potential sever lines or cut lines 136 of a PV laminate with one sub-panel having been cut and removed and capped with a capping bar 137 across exposed connectors are also shown in FIG. 1. PV laminate subsections 131, 132, and 133 are connected via a ribbon connector 139 and via a capping bar 137, which is shown pre-installation along the bottom edge of subsection 133. The capping bar may contain electrical connectors 138 that can cap exposed wiring created when a subsection is severed from another subsection. These potential sever lines or cut lines are shown at 136 of FIG. 1. The ribbon connector 139 is shown providing an output voltage to the microinverter 123 coupled to the PV laminate subsection 131. This microinverter is shown connected to shared electrical cabling 103 via nodes 102. As shown in more detail below, the PV laminate 130 may be configured to be cut along the cut lines 136 in order to change the output voltage of the PV laminate 130, to accommodate an installation obstacle, or for other reasons as well. To accommodate this resizing, the PV laminate 130 may have connectors and diodes or another circuitry between each subsection. These connectors and diodes or other circuitry can be configured to prevent shorting via exposed live wiring which may otherwise result when subsections connecting wiring is cut to allow for PV laminate resizing. A turn box 135 is shown, as can be seen, this turn box 135 is configured to electrically connect different PV laminates. Turn boxes in embodiments, may be configured to electrically connect two, three or more PV laminates together.

PV sub-panels 151, 152, and 153 are also shown in FIG. 1. As can be seen, connector leads 156 are employed to connect the PV sub-panels to each other. These connector leads 156 may be long or short in order to provide for variable spacing between sub-panels. The sub-panels of embodiments may be connected to a microinverter 123, which in turn may be connected to nodes 102 and a cable 104, which in turn may be connected to cable 103. The cables 103 and 104 may themselves be connected to a drop line 101, which may be tens or more feet long and may electrically connect the outputs to a grid or service box or load or other voltage recipient. The spacing between sub-panels can accommodate obstacles, such as obstacle 155. By using connector leads 156, different numbers of PV subpanels may be connected. This flexibility in the number of connected sub-panels can provide more tailored electrical outputs. For example, output voltages for a microinverter or other load may be increased or decreased by the voltage of a sub-panel being added or removed, rather than for the voltage of an entire PV panel being added or removed.

Thus, system embodiments may include the reconfigurable PV laminates, PV panels and components shown in FIGS. 2-16 in the same system. The PV laminates in embodiments may comprise glass and non-glass substrates. Non-glass substrates may be employed to increase the ease in which a laminate or panel may be cut in the field by an installer.

Figure 2:
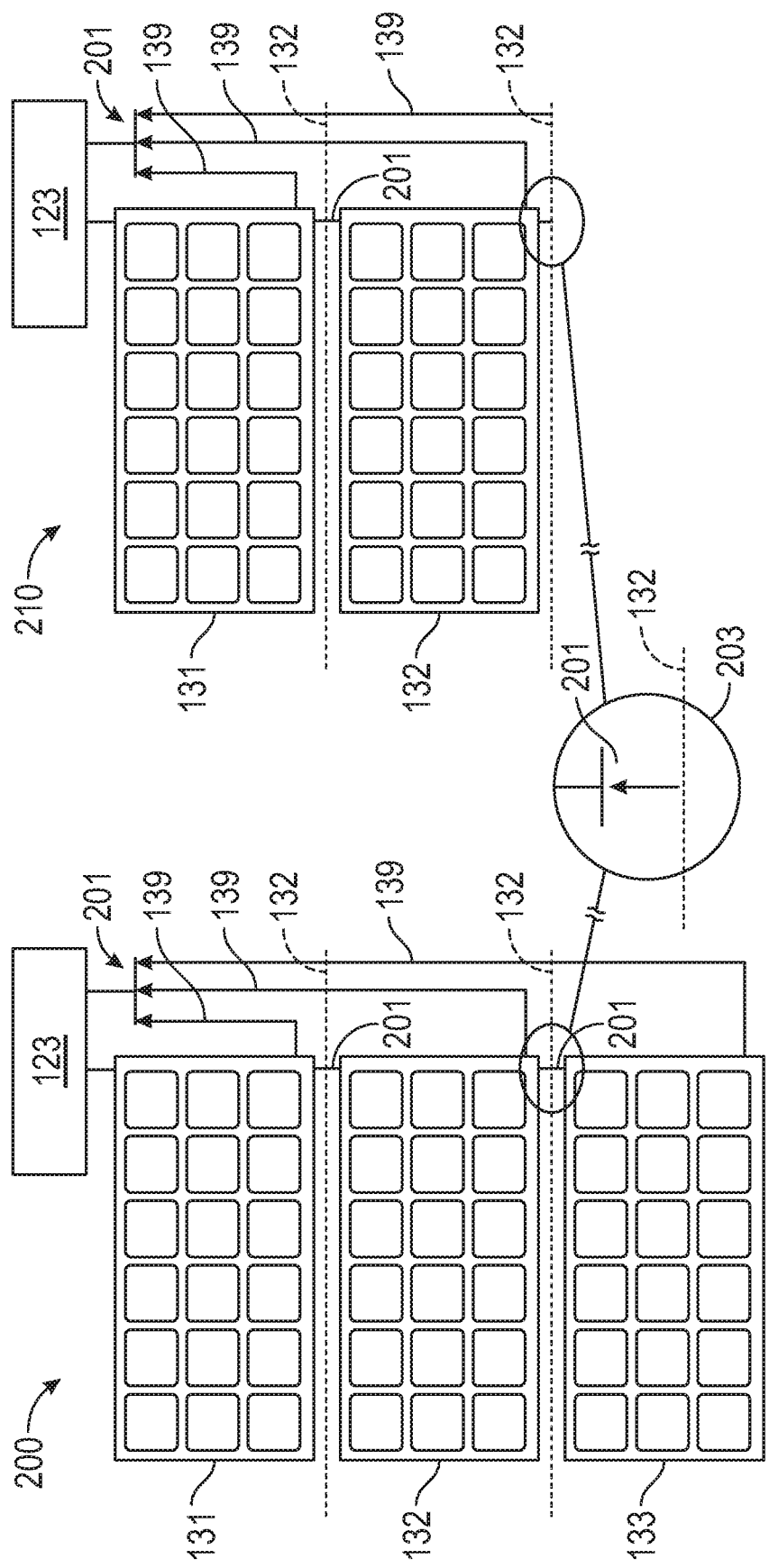
FIG. 2 illustrates schematics of reconfigurable PV laminates, including predetermined cut-lines, cutline connecting diodes, and microinverters, as may be employed according to some embodiments.

FIG. 2 illustrates a schematic of a PV laminate before 200 and after 210 the PV laminate has been cut. As can be seen, diodes 201 or other termination connectors may be employed on one side of a cut line 132 so that an exposed wire, strand, trace or another conductor does not remain after the PV laminate is severed across the cut line 132. In embodiments, an exposed live conductor is disfavored when operating voltages are expected to be above a nominal value, such as 0.1V-0.2V. Also labelled in FIG. 2 are the microinverters 123, laminate subsections 131, 132, and 133, connector detail 203, and ribbon connectors 139.

In embodiments, the microinverter 123 may be adaptable to operate and support full PV panels as well as fractions of those full PV panels. When multiple PV laminates are expected to be cut, embodiments may also provide for one or more microinverters to be removed because of the excess unnecessary and unused power handling capabilities. In embodiments, jumper cables or other connectors may be employed such that one or more PV panels or PV laminates may be joined to a single microinverter rather than each having their own. Thus, a reduction in microinverters may occur, and those microinverters that remain may operate more often in a range of full capacity as they are more likely supporting a full PV panel rather than one-half or three-quarters of a PV panel, which would occur when a microinverter supports a single cut PV panel.

Figure 3:
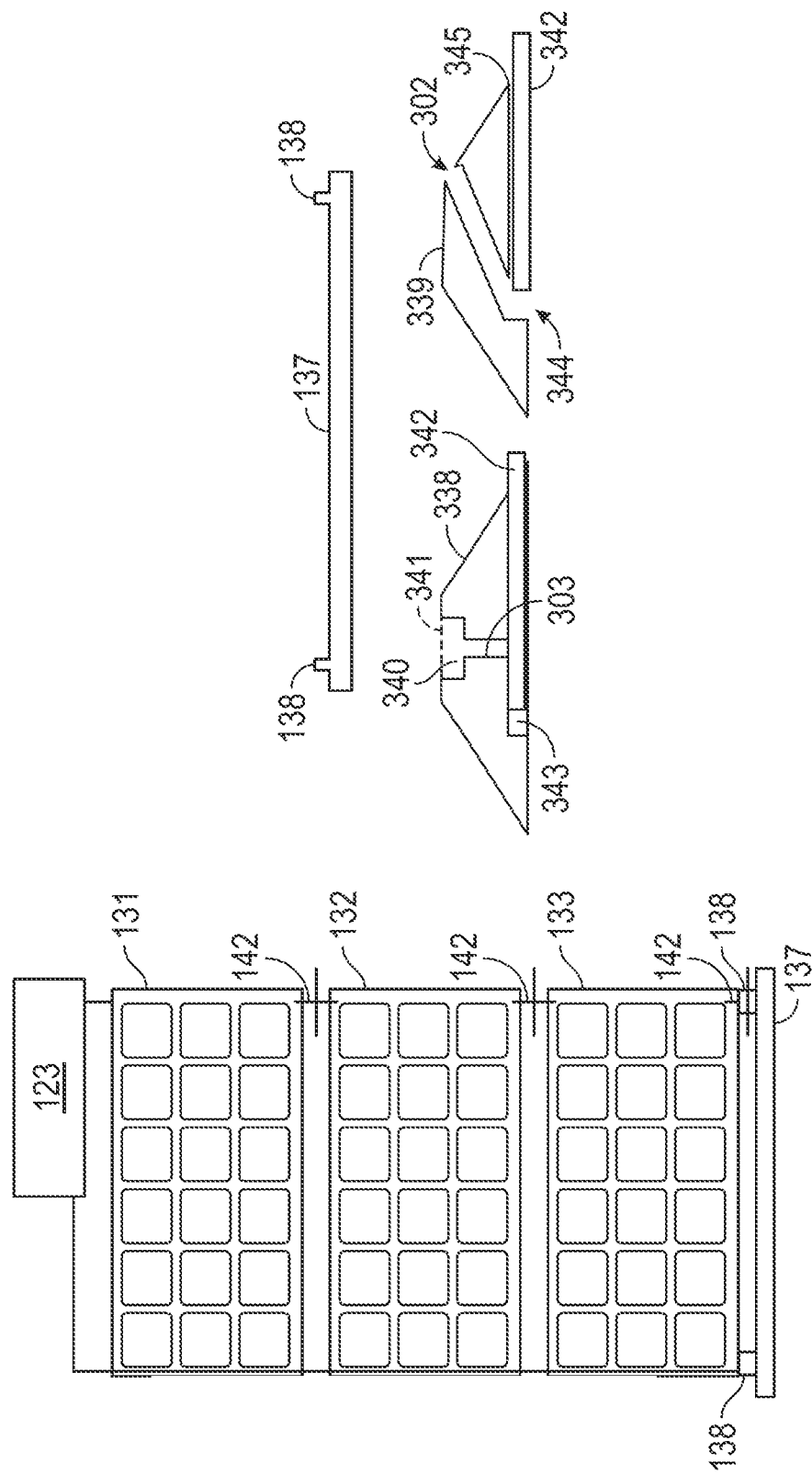
FIG. 3 illustrates exemplary PV rigidity supports as may be employed with connected reconfigurable PV laminates according to some embodiments.

FIG. 3 illustrates three PV laminates 131-133 connected by connectors 142 and a capping bar 137 having electrical connectors 138. Also illustrated is microinverter 123. FIG. 3 also illustrates a capping bar 137 and rigidity supports 338 and 339, which may be employed in embodiments, to support the capping bar 137 and any attached PV panels or PV laminates. The rigidity supports may be used for mounting the capping bar to a roof or other support and may include features for improved connection. Rigidity support 338, which is shown in cross-sectional view, is illustrated with screw holes 303. These holes may be spaced at regular intervals along the rigidity support 338 and may be used to secure the support to the capping bar 137. The rectangular recess 340 may be sized to receive the capping bar and hold it snuggly in place. A cap or cover or flap may also be placed over the capping bar once the capping bar is placed in the recess 340. The cap or cover or flap 341 may have penetrations for capping bar connectors 138 to protrude through but may otherwise seal the capping bar 137 in the recess 340. A channel 343 for receiving the laminate 342 may also be present in rigidity supports 338 of embodiments. Rigidity support 339 includes a ventilation channel 344 to allow air flow from one side of a laminate 342 to another side of the laminate. By providing the ventilation channel 344, pressure differences existing above and below the laminate 342 can be quickly equalized by having air pass through the ventilation channel and reduce or otherwise balance any transient pressure differences that may exist above and below the laminate 342. A channel 345 is formed in the rigidity support 339 for receipt of the laminate 342. The rigidity supports may also include connector caps for sealing exposed connectors along a side of a PV panel. The capping bars may also have various cross-sectional configurations with screw or other connector passages to enable connection of the bar to a roof or other support as well as to the PV panel. As noted, vents 302 may also exist in the rigidity bars. These vents may serve to convey rainwater as well as air. When air is conveyed through the vents 302 lifting and downdraft forces caused by air movement across the panels may be reduced. In other words, in embodiments, pressure differential between the top and bottom of the panel may be reduced by the venting through the rigidity bar.

Figure 4:
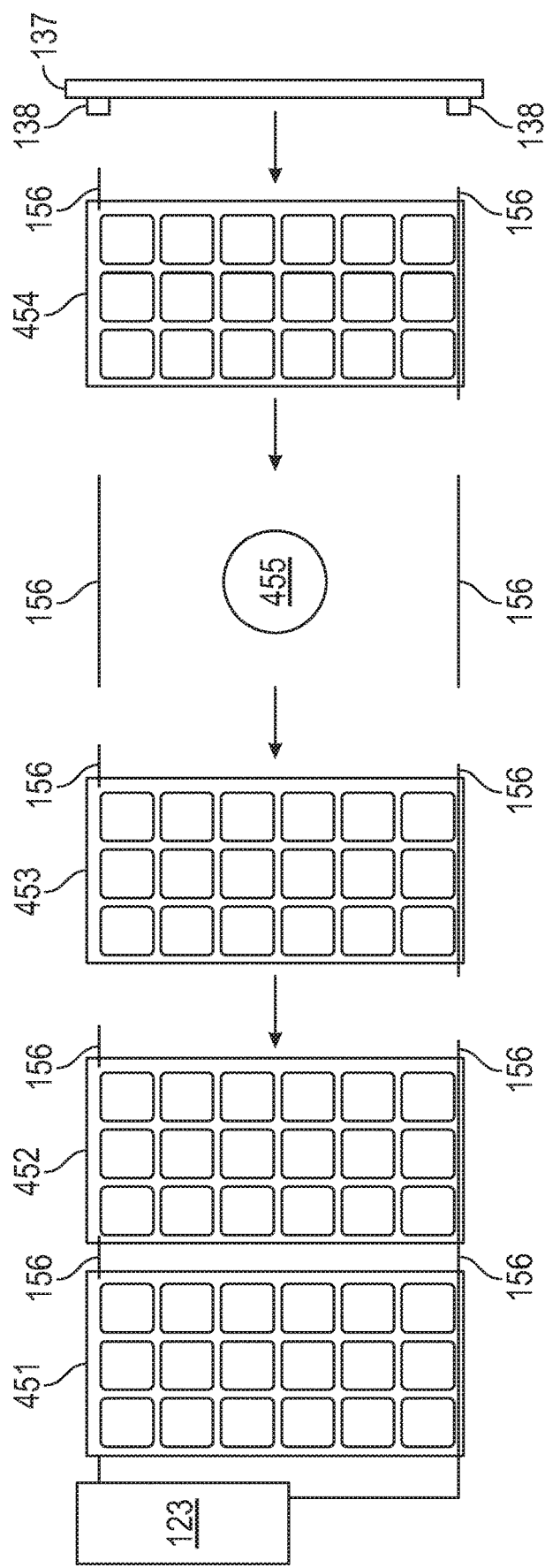
FIG. 4 illustrates a plurality of reconfigurable PV laminates as may be assembled with a connecting bar and jumpers to accommodate an obstacle or obstruction as may be employed according to some embodiments.

FIG. 4 illustrates how subpanels 451, 452, 453, and 454 may be spaced across a roofline using jumper cables 156, for spacing purposes. As can be seen in FIG. 4, a capping bar 137 having electrical connectors 138 may be positioned at one end of the reconfigurable PV panel subpanel 454 and jumper cabling 156 may be employed to connect subpanels 451, 452, 453, and 454, which were previously connected as a single panel, back together again. In other words, the PV subpanels illustrated in FIG. 4 were once a single panel, which was then cut between subpanel 451 and 452, between subpanel 452 and 453, and between subpanel 453 and 454, and these subpanels were then reconnected with jumper cabling 156, and a capping bar 137 was added to a side of subpanel 454. Once reconnected, all four subpanels could be serviced by their original microinverter 123 while traversing roof obstacle 455. In embodiments, mechanical and electrical leads may be connected to PV panels (or subpanels) and PV laminates (or portions thereof) on multiple sides of them to provide for mechanical connections between PV panels (or subpanels) and/or laminates (or portions thereof) and to provide electrical connections between PV panels (or subpanels) and/or laminates (or portions thereof).

Figure 5:
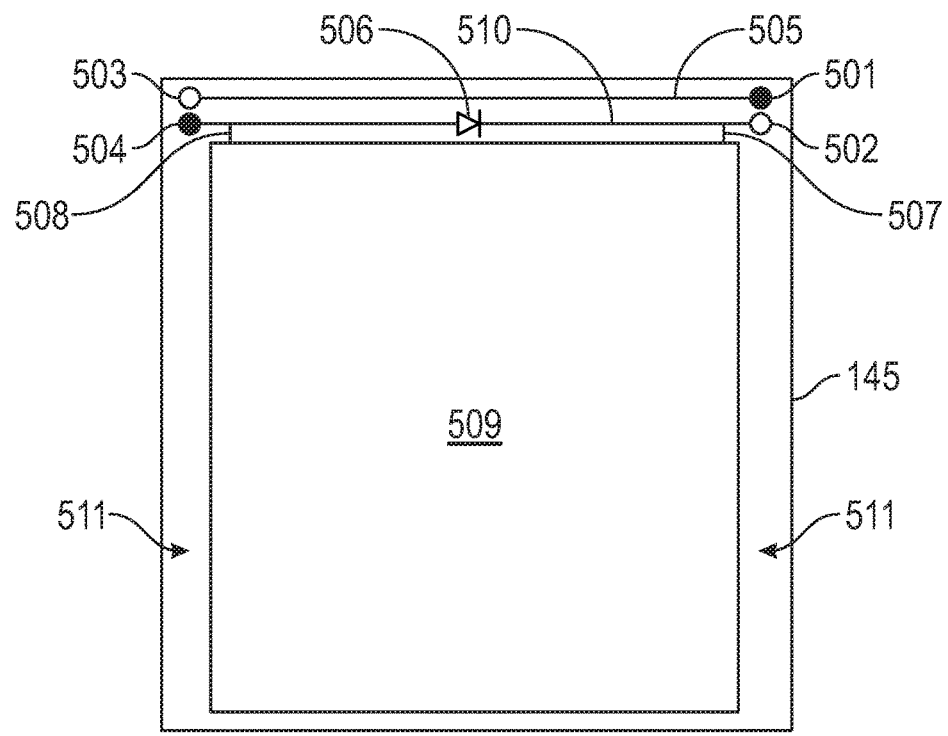
FIG. 5 illustrates a reconfigurable PV laminate with electrical connection ribbons and electrical connection terminals as may be employed according to some embodiments.
Figure 6:
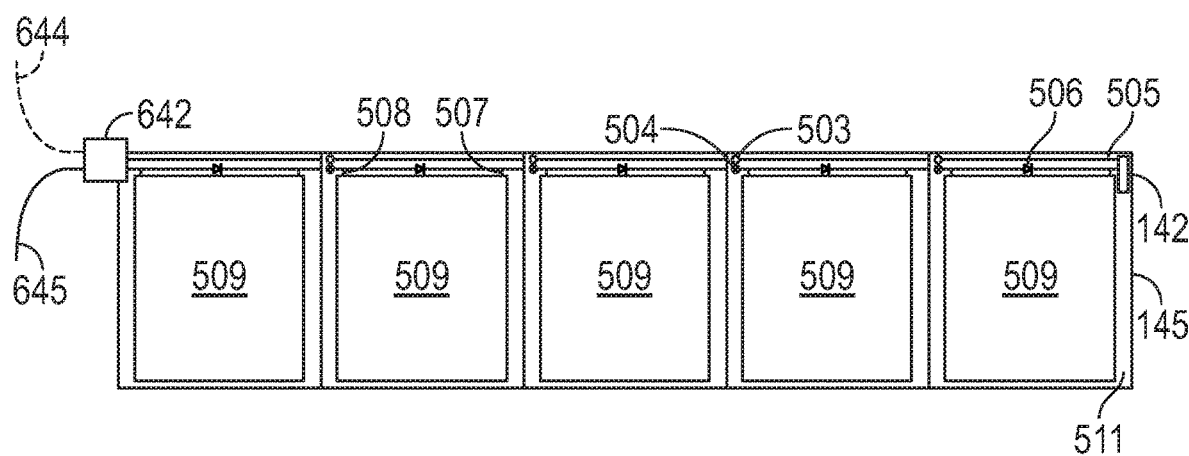
FIG. 6 illustrates reconfigurable electrical laminates arranged in a one-dimensional array, connected via electrical connection terminals, turn boxes, and electrical conductor connection ribbons, as may be employed according to some embodiments.
Figure 7:
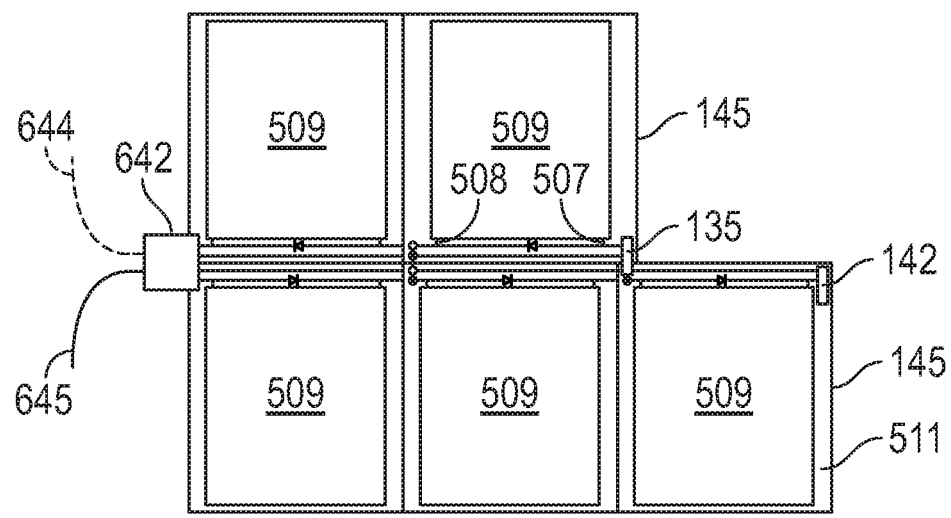
FIG. 7 illustrates reconfigurable electrical laminates arranged in a two-dimensional array, connected via electrical connection terminals, turn boxes, and electrical conductor connection ribbons, as may be employed according to some embodiments.

FIG. 5 shows a single reconfigurable PV laminate 145 as may also be employed in embodiments. As can be seen, this laminate 145 contains two trace or ribbon connectors 505, 510 along its top edge. The lower connector 509 is shown with negative 504 and positive 502 terminal leads as well as a diode 506. The upper ribbon connector 505 is shown with negative 501 and positive 503 homerun terminals and ribbon connector 505 between them. As is also shown in FIGS. 6 and 7, this reconfigurable PV panel 145 may be connected in various ways to other reconfigurable PV laminates. Also labeled in FIG. 5 are ribbon or trace connectors 507 and 508 and overlap surface 511. Reconfigurable PV laminate 145 can be provided in any desirable size or format. In one example, the reconfigurable PV laminate 145 can be substantially square or rectangular. Furthermore, reconfigurable PV laminate 145 can comprise any number of solar cells in any desirable array configuration. For example, the reconfigurable PV laminate 145 can comprise 16×16 pseudo-square cells.

In embodiments, when laminates 145 meet, their connectors may be connected to each other and jumpers may also be used when needed to cap unused connectors or to add additional PV laminates or PV panels to the joined system. FIG. 6 shows how a connector 142 may be employed in a single daisy chain series installation while FIG. 7 shows how a connector 142 and a turn box 135 may be employed when configuring two-dimensional arrays of PV laminates. Also labelled in FIGS. 6 and 7 are PV cells 509, trace connectors 507, 508, additional edge spacing for laminate tiling 511, string box 642, negative lead 645, and positive lead 644. The string box 642 may be configured with circuit topology that supports string-level rapid shutdown or pigtail connections.

The laminates, connections and circuit topology of FIGS. 5-7 enable a PV system which does not utilize "uncontrolled conductors" and instead uses only conductors which are formed in-laminate. This can present an advantage in terms of cost by including module level electronics (e.g. microinverters, DC optimizers, or shutdown switches) because some national electric codes (e.g. 2017 US NEC) can require all uncontrolled conductors in a rooftop solar array to be less than a predetermined voltage (e.g. 80V) within a set time (e.g. 30 seconds) of initiation of a rapid shutdown event. In jurisdictions with a rapid shutdown code, solar providers could be required to design systems utilizing module level electronics which are expensive and may provide little value beyond code compliance. In various embodiments relating to FIGS. 5-7, a PV system can comprise multiple lightweight, flexible (e.g. without front or cover glass) laminates including a solar cell circuit with a positive and negative connection and a secondary, separated, return ribbon with a positive and negative connection. The connections for both internal circuits (solar cell and return) are such that module laminates can be overlapped from one to the next to make an electrical connection to neighboring modules and to connect neighboring return ribbons. A string of multiple modules can be connected and on the last module an external "turning block" can be snapped into place to close the circuit and electrically connect the solar cell circuit to the return ribbon circuit. This approach provides a system of modules which does not require external wires (all wiring is internal to the laminate). One or more turn blocks can be provided in multiple forms depending on the desired panel connect connections and/or the shape of the array.

Figure 8:
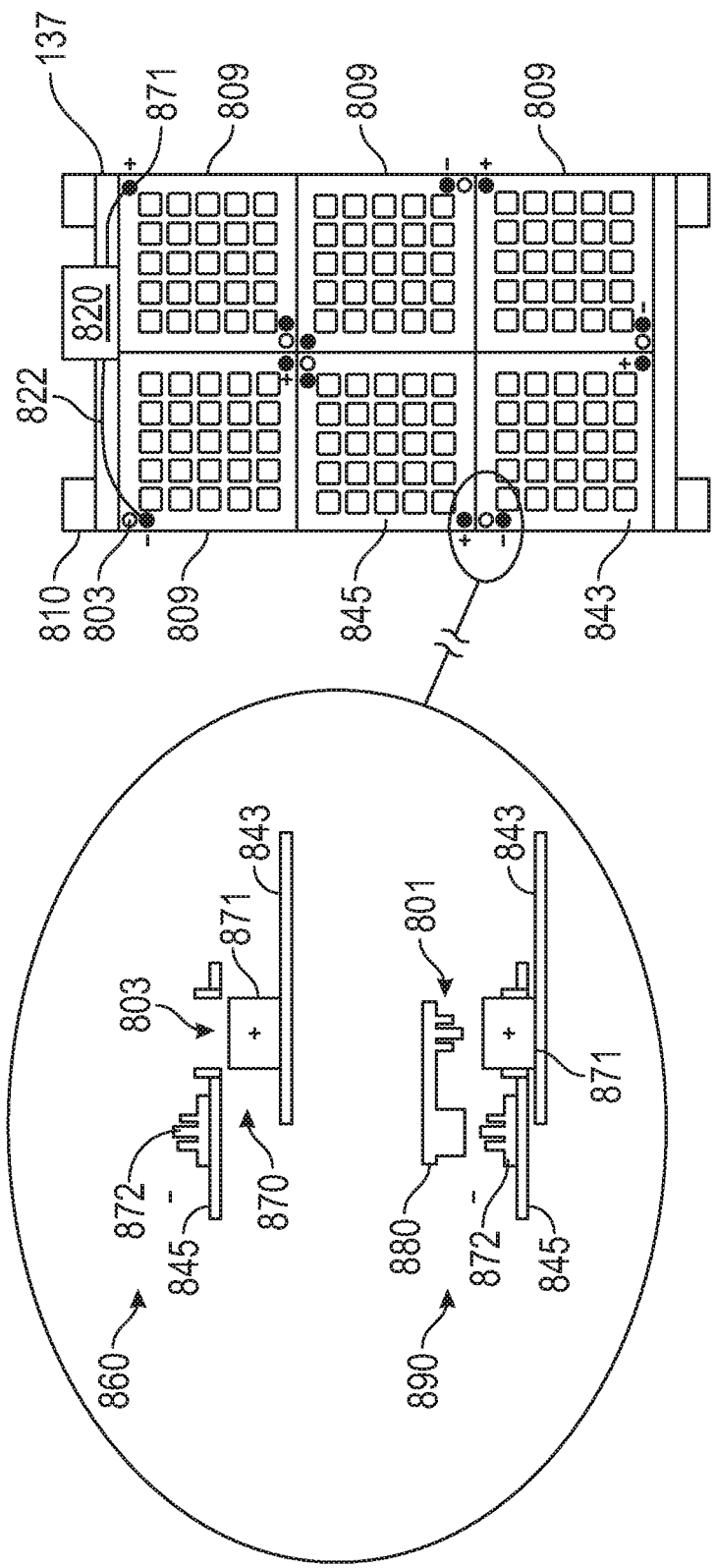
FIG. 8 illustrates an electrical connector that may be used to connect electrical connection terminals of an array of reconfigurable PV laminates as may be employed according to some embodiments.

FIG. 8 shows an exploded view on the left of how connections may be configured in some embodiments. FIG. 8 shows on the right a plurality of PV subsections that may be connected using the jumper connectors shown in the exploded view of FIG. 8. As can be seen, an electrical connection between PV subsections may be keyed so that it only connects in one orientation to PV panel terminals. As can also be seen, passthroughs may exist in PV panels to enable connection, both mechanical and electrical, between reconfigurable PV panels. The capping systems and connectors employed may serve to provide module length flexibility and, in some embodiments, length may be increased by one or two sections or more.

Jumper connector 860 is shown positioned above jumper connector 870. The mechanical attachment 871 is shown below passage 803. Also labelled in this connection are the PV laminate 845 and the PV laminate 843. As can be seen, the bottom jumper connector 870 is sized and configured to provide a mechanical connection with the top jumper connector 860. Once mated, as shown at arrow 890, a jumper connector bridge 880 may be used to electrically connect the mechanical attachment 871, which is also shown with a positive electrical connection to the PV laminate 843, to a negative electrical connector 872, which is electrically connected to the PV laminate 845. Other PV laminates 809 of FIG. 8 may also be mechanically and electrically joined in this fashion.

Also labelled in FIG. 8 are the hole 803 in PV laminate 809, flashing 810, connector bar 137, MLPE (module level power electronics) 820, which may be a DC optimizer or microinverter or other MLPE, pin connectors 801, and connecting cable 822. In embodiments, the PV laminates may also have supporting frames attached to them in order to provide additional structural support for the PV laminates. Thus, as can be seen in FIG. 8, embodiments may include connections of PV subsections that held together mechanically via the jumper connectors and electrically connected also via components of the jumper connecter. In this example, the jumper connector bridge 880 interfaces with MLPE as well as outside loads may be made through cabling, such as 822, as well as other connection techniques.

Figure 9:
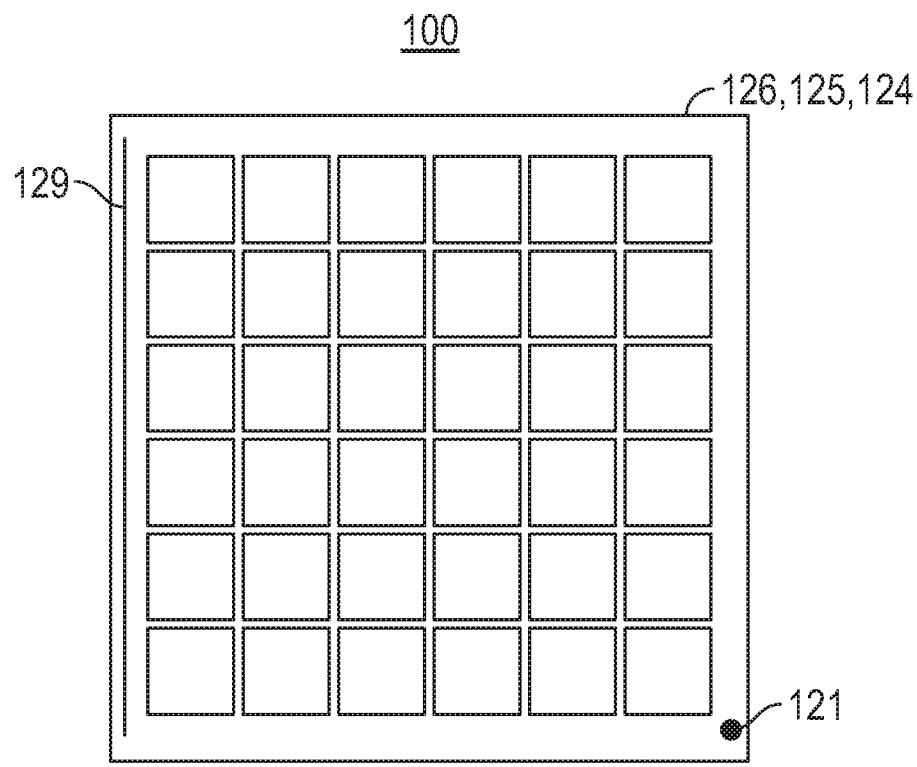
FIGS. 9-11 illustrate reconfigurable PV laminates, which are stacked and pivot about one or more mechanical pivoting connectors, as may be employed according to some embodiments.
Figure 10:
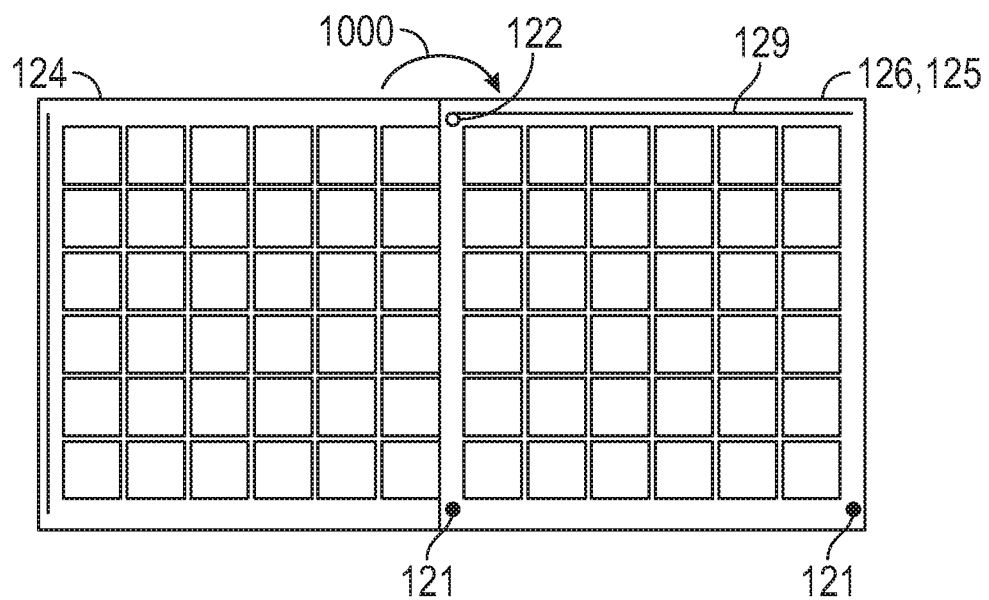
Figure 11:
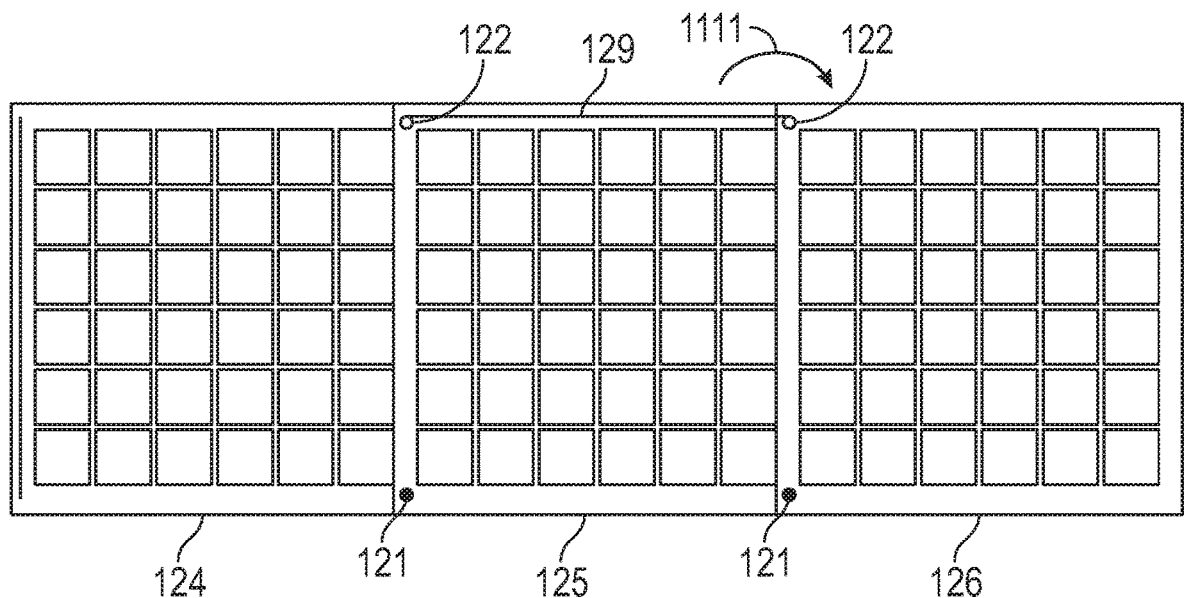

FIGS. 9-11 illustrate embodiments with stacked reconfigurable PV panels or PV laminates and how they may be rotated from a stacked position atop of each other, into an unstacked and one-dimensional array position. Each panel/laminate may rotate about swivel connections 121 and reach a deployed position in line with the PV panel or PV laminate below it. Once in the deployed position, the connections may have a bias, such as indentations, that holds the PV panels or PV laminates at preselected angles relative to each other. The swivel connection locations may also provide for overlap between adjacent panels, thereby setting up a predetermined shingling between stacked panels once they are unwound around each other. Embedded electrical cabling 129 may provide for electrical connections between PV panels 124, 125, and 126 of FIGS. 9-11. Mechanical connectors 122 may serve to inhibit rotation between PV panels or laminates once they have been deployed in a desired orientation. Also labeled are roof 100, mechanical connector 122, and direction of opening rotation arrows 1000, 1111.

Figure 12:
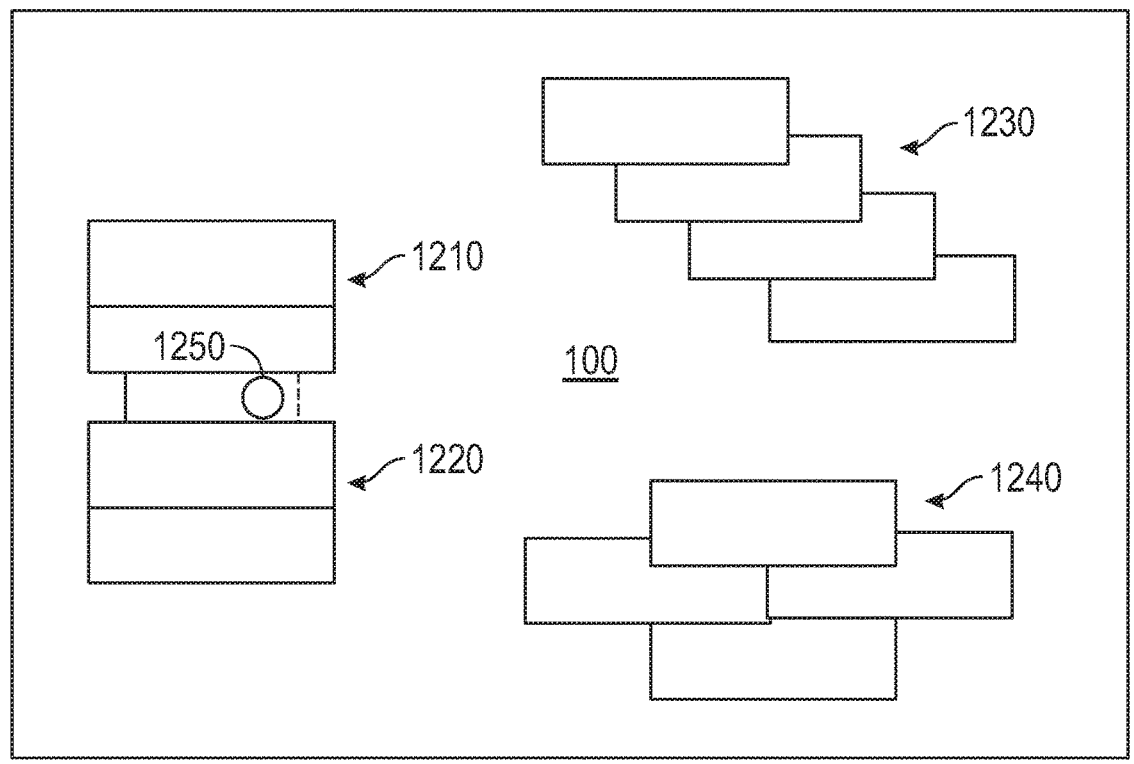
FIG. 12 illustrates exemplary positioning of installed reconfigurable PV laminates according to some embodiments.

FIG. 12 illustrates how PV panels or PV laminates 1210, 1220 may be installed around obstacles 1250; how PV panels or PV laminates may be shingled along a single axis of orientation as in 1230; or may be shingled along two axes of orientation as in 1240. Also labelled is roof 100. In other words, embodiments may be installed on various support structures, including residential roofs with different roof lines and stand-alone structures supporting a solar farm. Different configurations of PV laminates and PV panels may be assembled in order to be mechanically and aesthetically suitable for each roof line or other support system. For example, a larger PV panel form factor may be better suited for large planar roofs without many points or slopes while a smaller PV panel form factor may be more suitable for more detailed roof lines with multiple pitches and intersecting slopes. Accordingly, a reconfigurable PV panel or PV laminate may be advantageous as it may be resized to suit the specific roofline or other support structure to which it will be installed.

Figure 13:
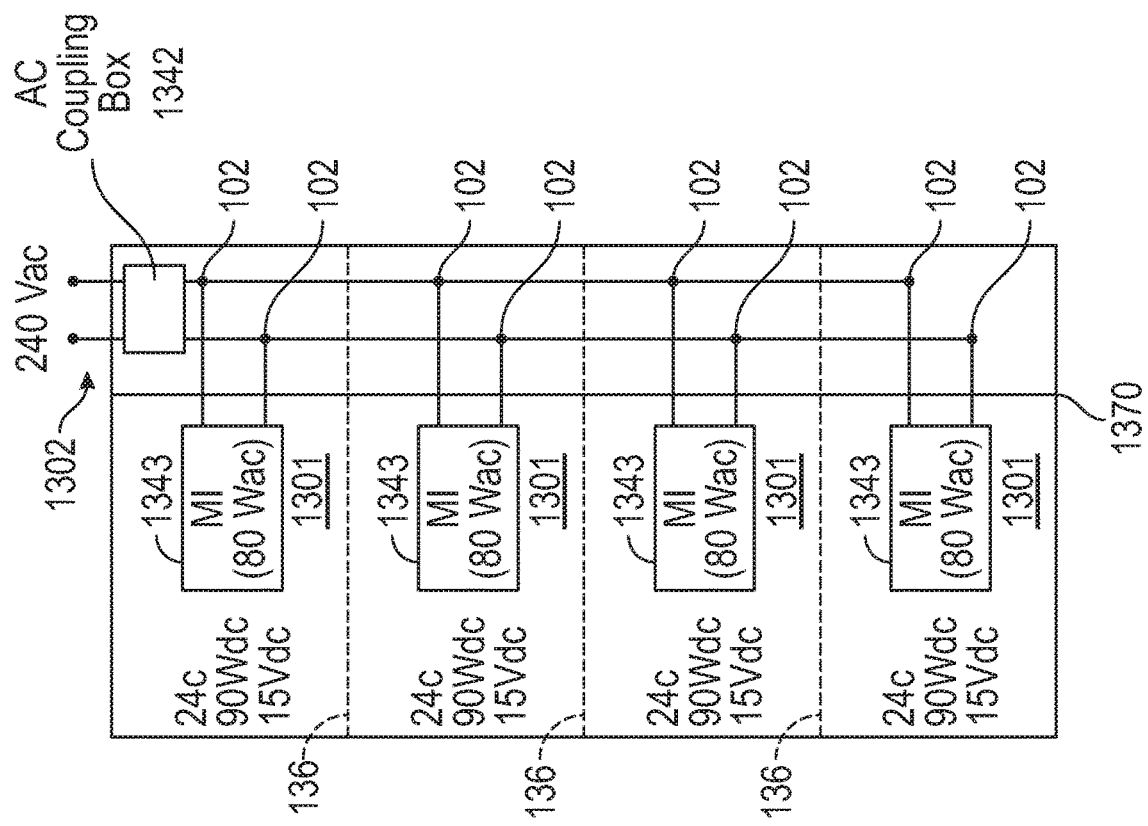
FIG. 13 illustrates the circuit topology of two PV modules, each with three separation lines, as may be employed according to some embodiments.
Figure 13:
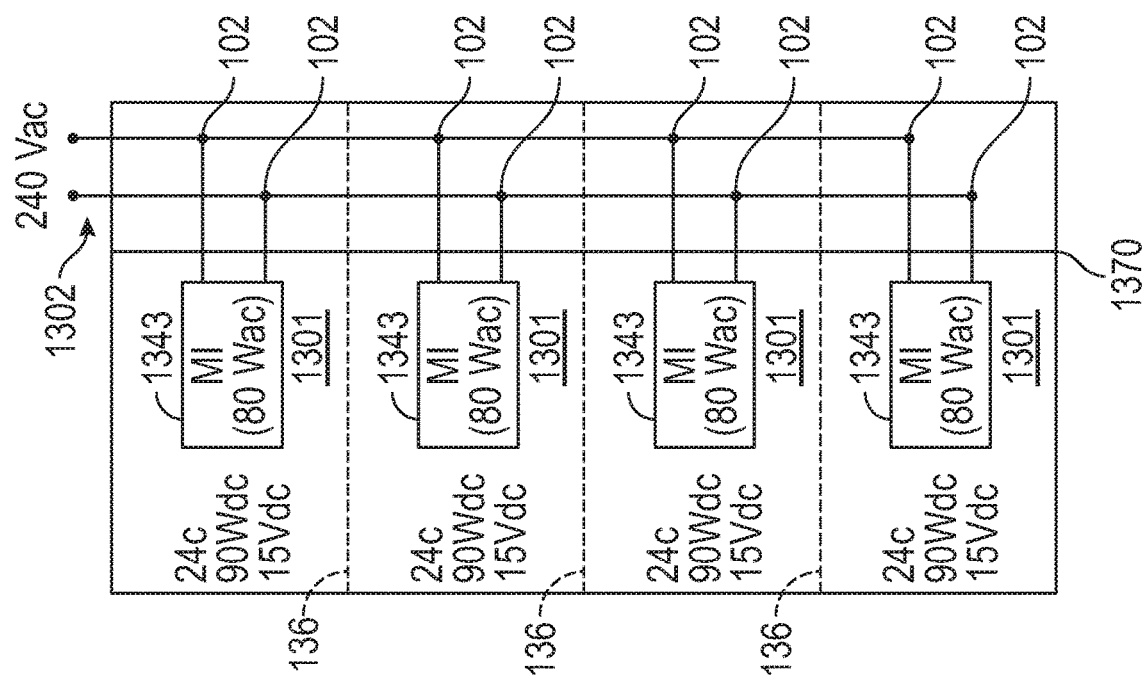

FIG. 13 shows the topology of two PV modules, each with three separation lines 136, as may be employed according to some embodiments. Four sub-modules 1301 are shown in each of the two PV modules. Each separation line 136 represents a foldable, cutable, or separable seam. Each of the four sub-modules 1301 may produce a quarter of the power when compared to the entire 96 PV cell PV module. This ¼th output would be approximately 80 WAC in this example. In this embodiment, each of the sub-modules 1301 may be separated from each and may function to produce power. The terminated connections, severed when one or more sub-panels is separated, can be managed in the PV module portion to the left of line 1370 in order to protect any previous live electrical connections. In some embodiments, an AC coupling box 1342 may be employed. This AC coupling box may have filtering and surge components or circuit topologies and may serve to protect any connected sub-modules. The sub-modules in these and other embodiments may have the filtering and/or surge components or circuit topologies removed from their individual microinverters if an AC coupling box with any absent functionality is employed. Connection nodes 102, VAC output 1302 and microinverter (MI) 1343 are also labelled in FIG. 13.

Figure 14:
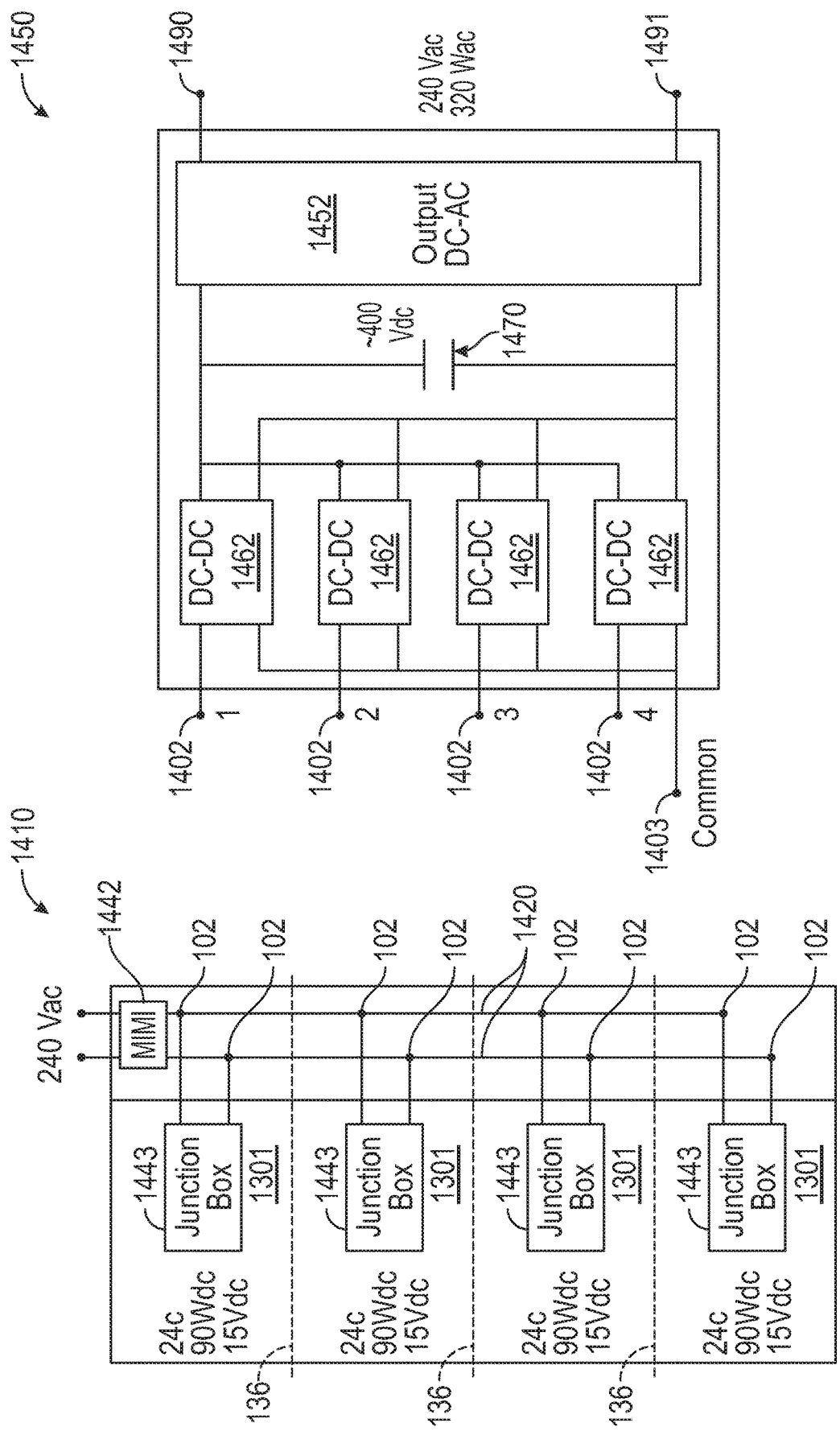
FIG. 14 illustrates a circuit topology of a PV module with three separation lines and a multiple-input microinverter that may be employed in conjunction with this PV module, as may be employed according to some embodiments.

FIG. 14 shows a PV module 1410 with three separation lines 136 and a multiple-input microinverter (MIMI) 1442 that may be employed in conjunction with this PV module according to some embodiments. Embodiments may include sub-modules with raw DC outputs at nodes 102 connected via a shared parallel bus 1420. An MIMI 1442 employed may include an input for each sub-module and a common ground, and may also include separate dc-dc converters or distinct dc-dc converter topology rated for ¼ power each when a four sub-module PV module is employed. Each dc-dc converter circuit or component in this and other embodiments may perform its own power point tracking and may also receive independent power-point tracking for its particular sub-module. As can be seen, the MIMI may be electrically connected to consolidate outputs into a high voltage bus (400 V). A junction box 1443 is also labelled in FIG. 14.

Thus, FIG. 14 illustrates the circuit topology of parallel-connected photovoltaic (PV) sub-modules 1301 and a microinverter that may be employed by each PV module. The PV modules are shown with a typical parallel configuration and 320-watt ac microinverter (MI) 1442. Each PV sub-module is labelled as including 24 PV cells that can cumulatively produce 360 watts DC at 60 Volts DC for the MI 1442 to convert to AC at 240 Volts. An MIMI block diagram 1450 of a three stage MIMI that may be employed by the PV modules is shown. As can be seen, the DC voltage is boosted by a DC-DC converter 1462, converted to AC, filtered/conditioned at 1470, and bracketed prior to output at 1490, 1491 by the microinverter 1450 at 240 Volts AC. Numerous other configurations and outputs as well as inputs may also be employed in this and other embodiments. Also labelled are junction box connections 1402, common ground 1403, and DC-AC inverter circuit 1452.

Figure 15:
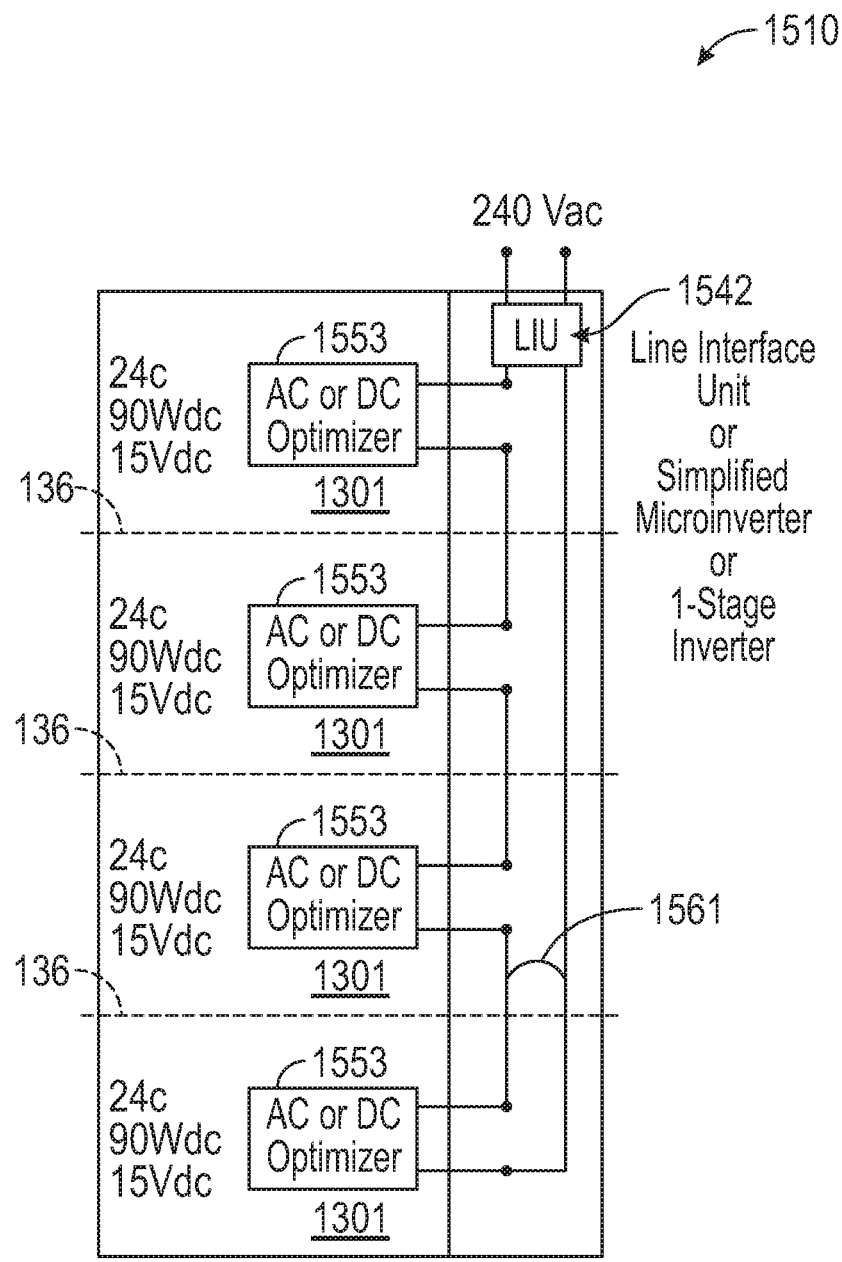
FIG. 15 illustrates circuit topology of a PV module with three separation lines and an accompanying AC optimizer for each PV sub-module along with a cumulative line interface unit, as may be employed according to some embodiments.

FIG. 15 shows a PV module 1510 with three separation lines 136 and an accompanying AC optimizer 1553 for each PV sub-module 1301, along with a cumulative line interface unit or Simplified Microinverter or 1-Stage Inverter 1542, as may be employed according to some embodiments. As can be seen, embodiments may include separable PV modules where one or more of the sub-modules includes a low voltage AC output. These low voltage outputs may then be consolidated in series, rather than parallel. In these or other embodiments, a "line interface unit" may be configured to accept the series AC power and provides the appropriate filtering and line interface functionality as described herein. When series sub-panels are employed, jumper wires 1561 may be used to prevent open circuits that can result when one or more sub-modules is removed. In embodiments, upon installation, an installer may cut the entire bottom segment out at the bottom separation line or may cut the jumper wire 1561 to enable the bottom segment to participate in the power production. Other jumper wire locations and configurations may also be employed for purposes of enabling different separation lines to be cut from the bottom up, but only one is shown.

Figure 16:
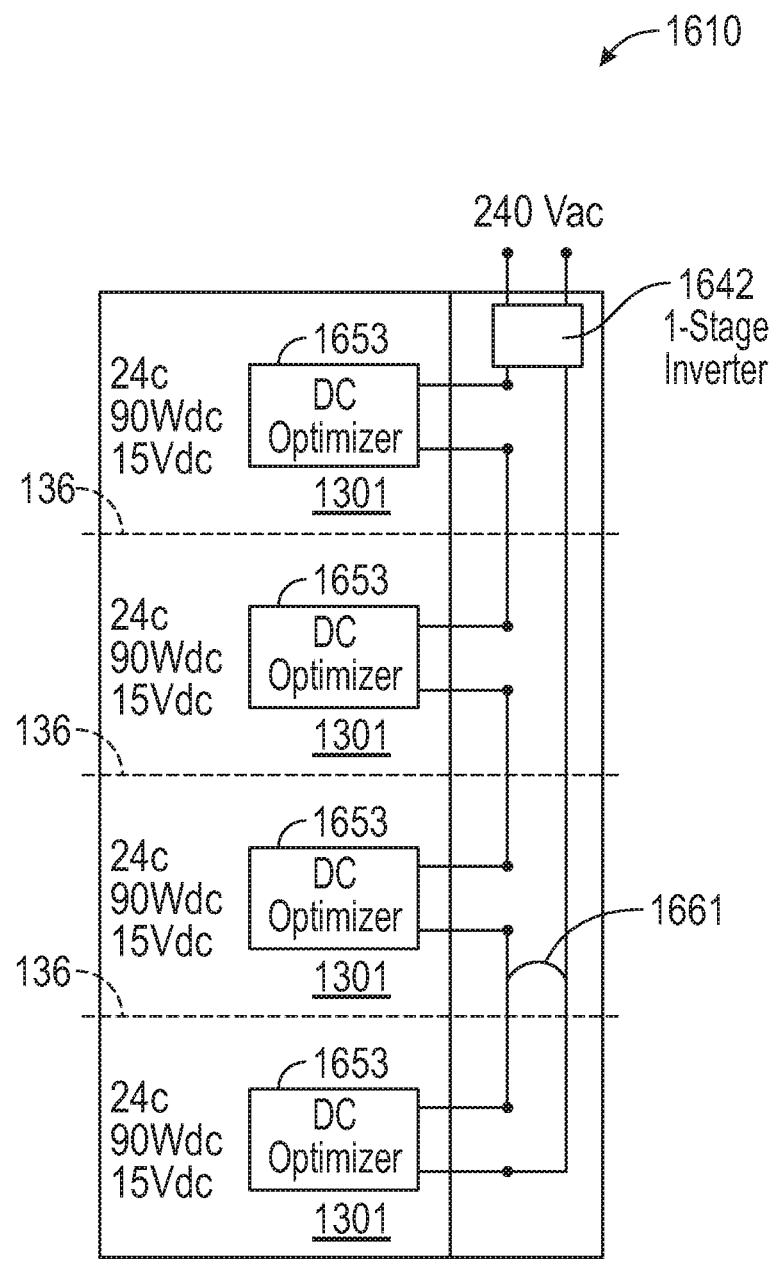
FIG. 16 illustrates circuit topology of a PV module with three separation lines and an accompanying DC optimizer for each PV sub-module along with a cumulative single-stage inverter, as may be employed according to some embodiments.

FIG. 16 shows a PV module 1610 with three separation lines 136 and an accompanying DC optimizer 1653 for each PV sub-module 1301 along with a cumulative single-stage inverter 1642, as may be employed according to some embodiments. Corresponding to the embodiments of FIG. 15, rather than employing AC optimizers, embodiments may also employ DC converters connected in series, rather than AC converters. In this embodiment, as well as in others, a microinverter employed may have reduced complexity with a single stage (DC-AC) inverter 1642 and no boost or output filtering. With either series or optimizer approach, embodiments may be limited to removing a single sub-module 1301 from a PV module when threshold values for voltage or line interface exist. In embodiments, upon installation, an installer may cut the entire bottom segment out at the bottom separation line or may cut the jumper wire 1661 to enable the bottom segment to participate in the power production. Other jumper wire locations and configurations may also be employed for purposes of enabling different separation lines to be cut from the bottom up, but only one is shown.

Still further, embodiments may employ various combinations of power support circuitry as identified above, including as in FIGS. 13-16 for PV modules having the same or different PV cell counts. PV cell counts may also be the same or different for each sub-module and related circuitry may be adjusted accordingly. The PV cells of the sub-modules, whether PV laminates or PV panels, may be full sized or comprise laser cut multi-cells, which would boost the voltage and may be advantageous for embodiments employing optimizers.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A photovoltaic (PV) system comprising:
a plurality of PV laminates each comprising:
a PV cell circuit including a plurality of PV cells connected in series between a negative cell terminal lead and a positive cell terminal lead;
a return ribbon between a negative homerun terminal and a positive homerun terminal;
wherein each of the PV laminates of the plurality of PV laminates comprises a first peripheral side and a second peripheral side, the first peripheral side touching the second peripheral side,
wherein each of the PV laminates in the plurality of PV laminates are arranged in an array such that adjacent PV laminates are overlapped to connect positive and negative homerun terminals of at least one of a PV laminate of the plurality of PV laminates with a positive and negative homerun terminal of an adjacent PV laminate, and
a turn box positioned and configured to close an open circuit of the array, the turn box positioned to electrically connect a positive homerun terminal of a first PV laminate of the plurality of PV laminates and a negative homerun terminal of a second PV laminate of the plurality of PV laminates, adjacent the first PV laminate, and one of a positive or negative terminal lead of a third PV laminate of the plurality of PV laminates.

2. The PV system according to claim 1 further comprising:
a string box including a negative system lead and a positive system lead, the string box connecting to a homerun terminal of one or more PV laminates of the plurality of PV laminates at a first peripheral side of the array.

3. The PV system according to claim 2, wherein the negative and positive system leads output power from the PV laminates of the plurality such that all PV laminate wiring is internal to the PV laminates.

4. The PV system according to claim 1, wherein connections between cell terminal leads and homerun terminal are snap-in electrical connections.

5. The PV system according to claim 1, wherein the PV laminates are flexible.

6. The PV system according to claim 1 further comprising a diode between the negative cell terminal lead and the positive cell terminal lead.

7. The PV system according to claim 1, wherein each PV laminate comprises edge spacing regions sized for PV laminate tiling, and wherein at least one negative cell terminal lead and at least one positive cell terminal lead is electrically connected to each other via a single jumper connector.

8. A reconfigurable photovoltaic (PV) laminate system comprising:
a plurality of separable PV laminate subpanels, each of the PV laminate subpanels comprising a positive connection terminal, a negative connection terminal, and a homerun terminal;
a first PV laminate subpanel of the plurality electrically connected to a second PV laminate panel of the plurality via a first mated connection terminal from each of the first PV laminate subpanel and the second PV laminate subpanel, the first and second PV laminate subpanel positioned in a first row and overlapping at the first mated connection terminal from each of the first PV laminate subpanel and the second PV laminate subpanel;
a third PV laminate subpanel of the plurality connected to the second PV laminate subpanel of the plurality via a second mated connection terminal from each of the second PV laminate subpanel and the third PV laminate subpanel, the third PV laminate subpanel positioned in a second row, the second row adjacent the first row; and,
a turn box electrically connecting a homerun connection terminal from the first, the second, or the third PV laminate subpanel, to a positive or negative connection terminal of the other remaining two connection terminals and spanning a peripheral side of each of the first, second and third PV laminate subpanels,
wherein each connection terminal for each PV laminate subpanel of the plurality is resident in laminate of their respective PV laminate subpanel.

9. The reconfigurable photovoltaic laminate system of claim 8 wherein connection terminals of each of the PV laminate subpanels are electrically connected via embedded ribbon connectors.

10. The reconfigurable photovoltaic laminate system of claim 9 wherein at least one embedded ribbon connector from each of the PV laminate subpanels comprises an intervening diode.

11. The reconfigurable photovoltaic laminate system of claim 8 further comprising a rigidity bar, the rigidity bar comprising at least two connectors configured to electrically connect with at least one PV laminate subpanel of the plurality of PV laminate subpanels.

12. The reconfigurable photovoltaic laminate system of claim 9 wherein the jumper connector is positioned perpendicular to an embedded ribbon connector.

13. The reconfigurable photovoltaic laminate system of claim 8 wherein each of the PV laminate subpanels of the plurality include a pair of connection ribbons running parallel to each other and positioned along a peripheral side of its respective PV laminate subpanel, the connection ribbons electrically connecting connection terminals located on its respective PV laminate subpanel.

14. The reconfigurable photovoltaic laminate system of claim 8 further comprising a converter, the converter configured to receive electrical voltage from a first PV laminate subpanel when the first PV laminate subpanel is electrically coupled to a first grouping of PV laminate subpanels of the plurality and a second grouping of PV laminate subpanels, the second grouping containing fewer PV laminate subpanels than the first grouping.

15. The reconfigurable photovoltaic laminate system of claim 8 further comprising a line interface unit (LIU), the LIU configured to accept series AC power from the plurality of PV laminate subpanels and provide electrical filtering and line interface management to an electrical output.

16. A reconfigurable photovoltaic (PV) panel system comprising:
- a plurality of separable PV laminate subpanels,
- each of the PV subpanels of the plurality of separable PV subpanels comprising in-laminate trace connectors spanning between and electrically connecting positive and negative connection terminals and a homerun connection terminal,
- a turn box electrically connecting a connection terminal on a first, second, and third PV subpanel of the plurality and the turn box spanning a peripheral side of each of the first, second and third PV subpanels, and
- each of the PV subpanels electrically connected to at least one other PV subpanel of the plurality a connection of its own and a positive or negative connection terminal of an adjoining PV subpanel of the plurality,
- wherein at least one of the PV subpanels of the plurality comprises a jumper connector electrically connecting positive or negative connection terminals with a homerun connection terminal from the at least one PV subpanel of the plurality.

17. The reconfigurable photovoltaic (PV) panel system of claim 16 wherein the connection terminals are positioned along adjoining perimeter sides of their respective PV subpanels.

18. The reconfigurable photovoltaic (PV) panel system of claim 16 wherein PV subpanels of the plurality overlap with an adjacent PV subpanel when electrically connected via connection terminals to an adjacent PV subpanel.

19. The reconfigurable photovoltaic (PV) panel system of claim 16 wherein the jumper connector is removable.

20. The reconfigurable photovoltaic (PV) panel system of claim 16 wherein each of the PV subpanels has a tiling edge, the tiling edge configured without PV cells, the tiling edge of a first PV subpanel positioned below an adjacent second PV subpanel when the first PV subpanel is connected to the second PV subpanel.

* * * * *